United States Patent [19]

Mahler

[11] Patent Number: 5,376,180

[45] Date of Patent: Dec. 27, 1994

[54] APPARATUS FOR HOLDING DISK-SHAPED SUBSTRATES IN THE VACUUM CHAMBER OF A COATING OR ETCHING APPARATUS

[75] Inventor: Peter Mahler, Hainburg, Germany

[73] Assignee: Leybold Aktiengesellschaft, Hanau, Germany

[21] Appl. No.: 201,874

[22] Filed: Feb. 25, 1994

[30] Foreign Application Priority Data

Feb. 25, 1993 [DE] Germany .............................. 4305750

[51] Int. Cl.$^5$ ............................................. C23C 16/00
[52] U.S. Cl. ...................................... 118/728; 118/729; 118/730; 118/503; 156/345
[58] Field of Search ............... 118/728, 729, 730, 503; 156/345

[56] References Cited

U.S. PATENT DOCUMENTS

| | | | |
|---|---|---|---|
| 4,535,835 | 8/1985 | Holden | 118/728 |
| 4,796,562 | 1/1989 | Brors | 118/728 |
| 4,823,736 | 4/1989 | Post | 118/728 |
| 5,238,499 | 8/1983 | van de Ven | 118/728 |

*Primary Examiner*—Richard Bueker
*Attorney, Agent, or Firm*—Felfe & Lynch

[57] ABSTRACT

A rectangular substrate bed has on its top surface a row of disk-shaped holding members on which disk-shaped substrates are laterally positioned by a frame member having circular openings which expose the substrates. Seals are provided on each holding member so that substrates can be held in place by vacuum. The frame member is fixed to the substrate bed by clamps having pins which are received in bores at opposite ends of the substrate bed and the frame member.

6 Claims, 3 Drawing Sheets

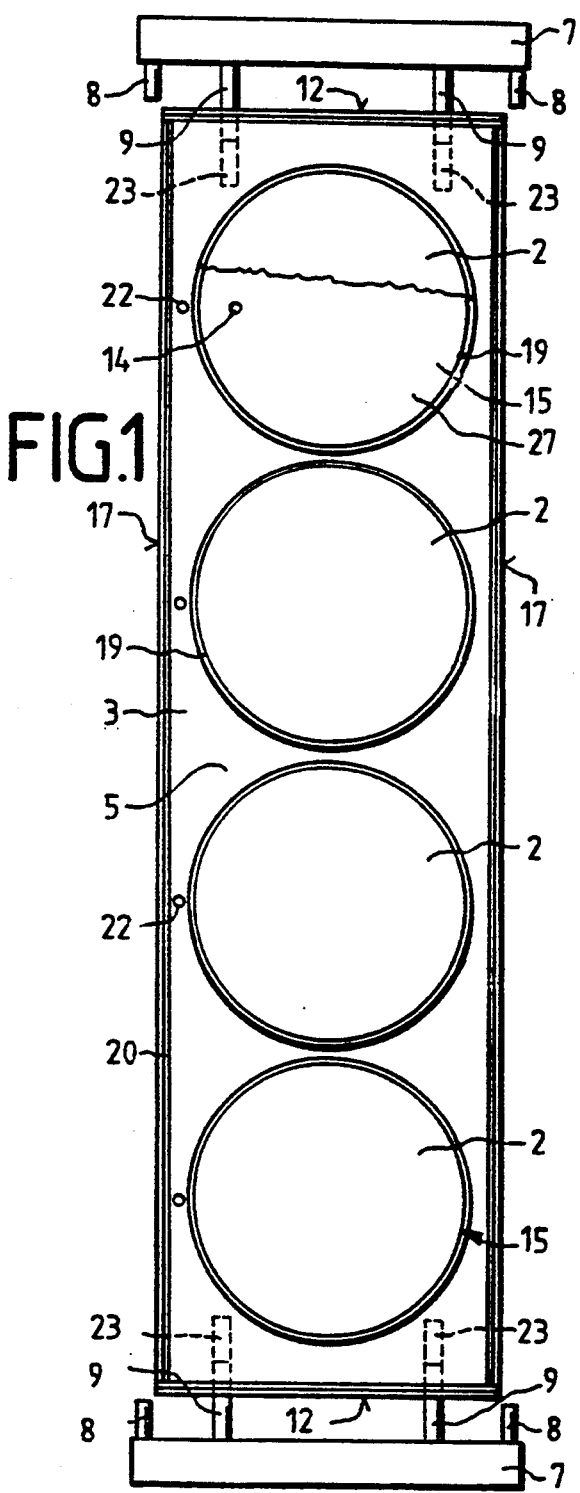
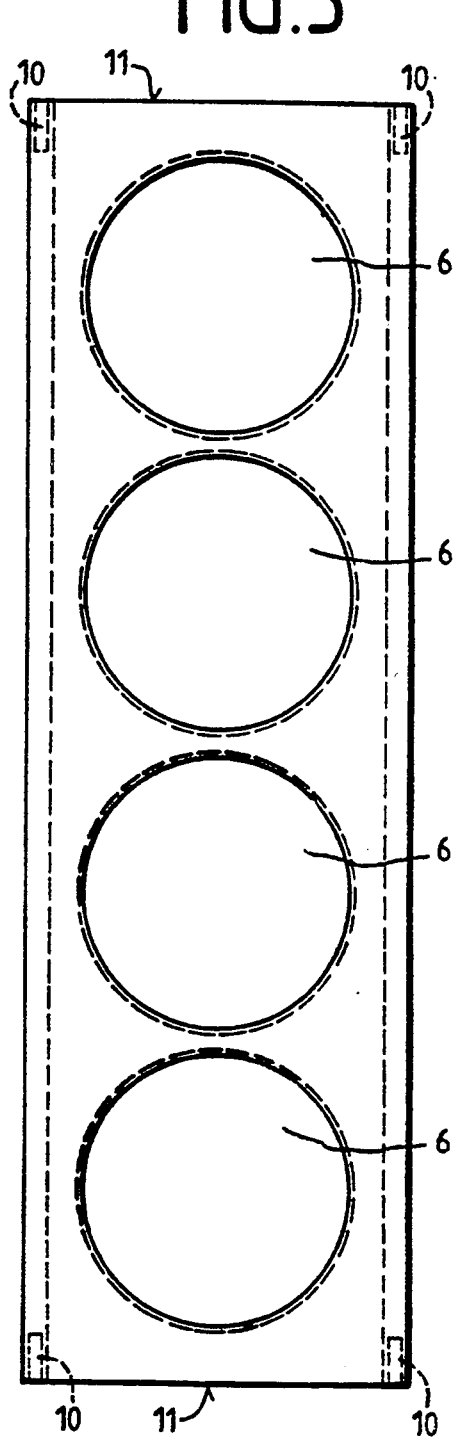
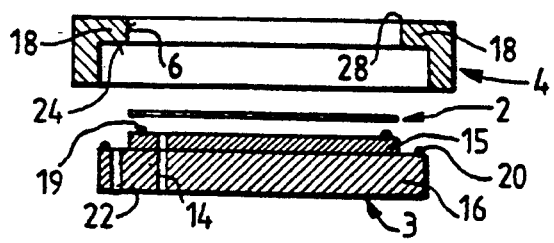

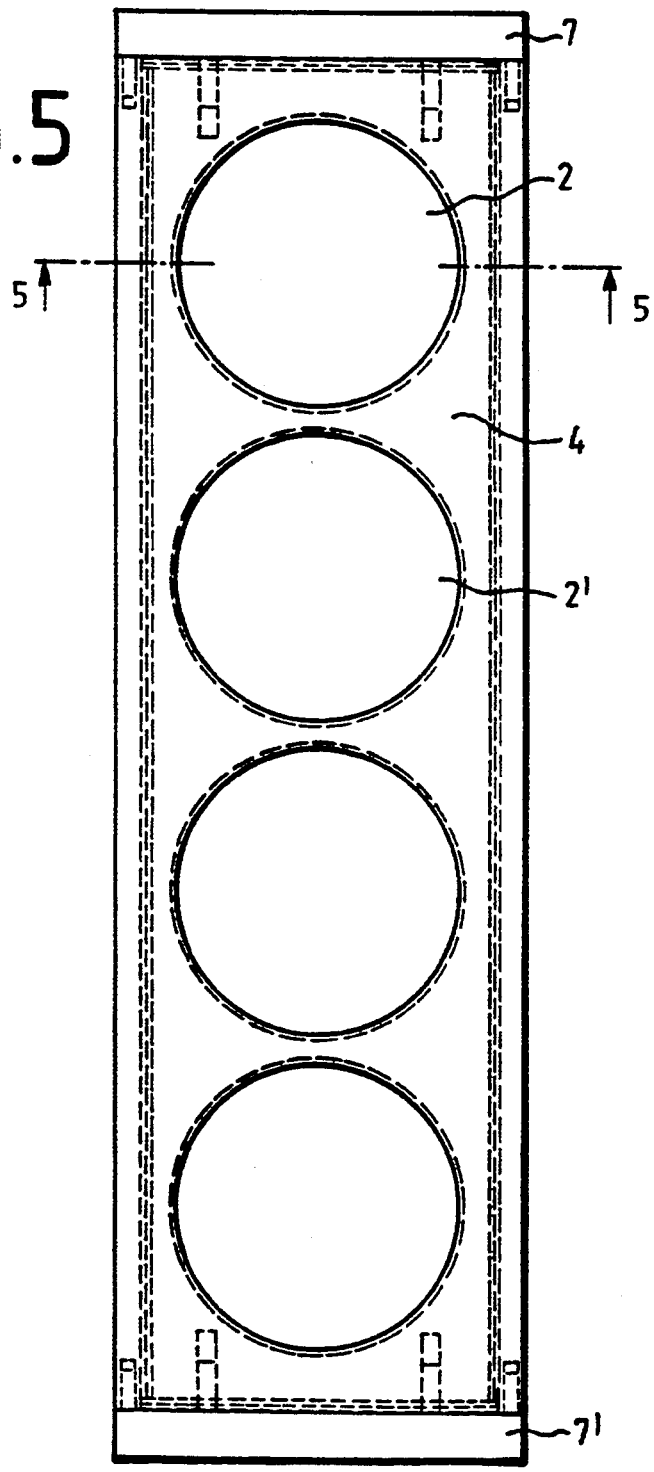

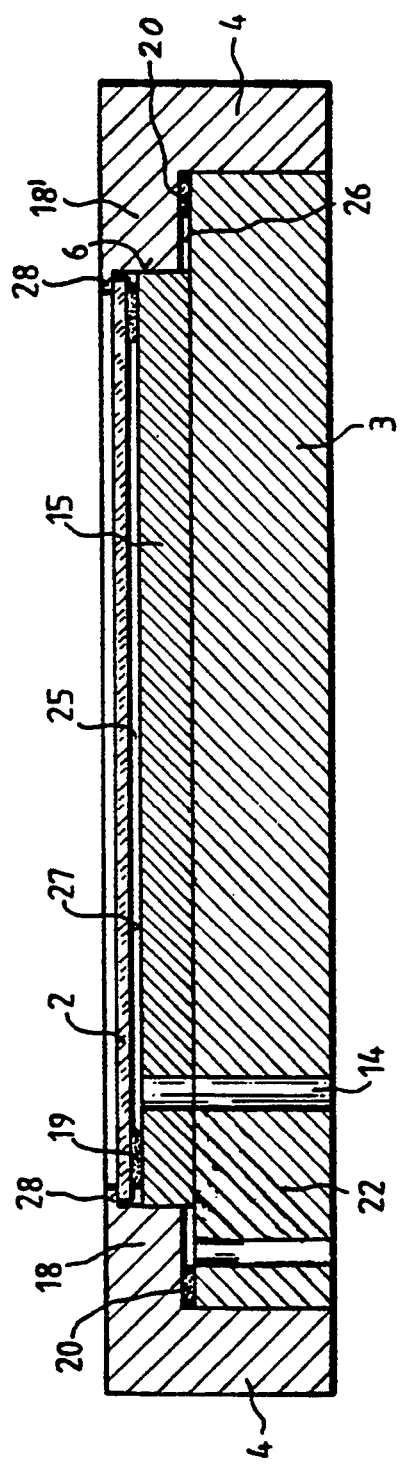

5,376,180

APPARATUS FOR HOLDING DISK-SHAPED SUBSTRATES IN THE VACUUM CHAMBER OF A COATING OR ETCHING APPARATUS

BACKGROUND OF THE INVENTION

The invention relates to apparatus for holding disk-shaped substrates in the vacuum chamber of a coating or etching apparatus, having a planar substrate bed with a preferably rectangular plan, especially for fastening to a rotating drum.

In practice it has proven to be problematical to arrange thin substrates of fragile material, such as wafers, on the substrate holder so that they will not slip off when the substrate holder is rotated to a vertical position. Also, it has proven to be difficult to assure sufficient cooling of the substrates when they are so thin that even very slight clamping forces result in a flexing of the substrate, so that the substrates no longer lie with their full surface against a water-cooled substrate bed.

SUMMARY OF THE INVENTION

The present invention is addressed to a flat substrate bed or which will permit effective cooling of the substrates during the vacuum process, without any deformation or destruction of the substrates.

A frame member covering the upper side of the substrate bed has a number of apertures corresponding to the number and configuration of the substrates, and is fastened by clamps to the substrate bed. The clamps are provided with pins or studs which correspond with bores in the two end faces of the frame member and in the two end faces of the substrate bed. At least one sealing ring lies on the upper surface of the substrate bed and runs parallel to the periphery bordering the upper surface of the substrate bed. Bores in the upper surface of the substrate bed can be connected to a vacuum source or a gas source.

Preferably the portions of the frame member that run parallel to the longitudinal sides of the substrate bed have an approximately L-shaped profile, and the limb running horizontally reaches at least to a plane above the upper surface of the substrates, while the areas of the openings facing the cylindrical lateral surfaces of the holding disks prevent displacement of the substrates in the substrate plane.

The sealing rings which lie on the peripheral portions of the upper surfaces of the holding disks are preferably a gel which creates thin interstices between the overlying substrates and the upper surfaces of the holding disks, and these interstices can be connected to a suction pump or a gas source.

BRIEF DESCRIPTION OF THE DRAWINGS

FIG. 1 is a plan view of a substrate bed with the corresponding pair of clamps.

FIG. 2 shows a section taken transversely through the substrate bed, the frame member and a substrate.

FIG. 3 is a plan view of the frame member.

FIG. 4 is a section taken through the assembled device along the
lines A–B of FIG. 5.

FIG. 4a is a section according to FIG. 4, but on a larger scale, and

FIG. 5 is a top plan view of the device with substrates laid thereon.

DETAILED DESCRIPTION OF THE PREFERRED EMBODIMENT

Referring to FIGS. 1 and 2, the apparatus includes a flat substrate bed 3 of rectangular plan, on whose upper side 5 a total of four disk-shaped holding members 15 are fixed in a row. Bores 14 are provided through each holding member 15 and the substrate bed 3, and a sealing ring 19 is disposed on the upper surface 5 of each member 15. Bores 22 are provided through the substrate bed 3 outside of the holding members 15, and a sealing gasket 20 is provided on the substrate bed 3 at its outer periphery. Two clamps 7 are joined by pins to the end faces 12 of the substrate bed 3 which has corresponding blind holes 23. A frame member 4 of channel-shaped cross section can be placed over the substrate bed 3, and has bores 10 on its opposite narrow end faces 11 to receive the pins 8 on clamps 7. The frame member 4 is provided with four apertures 6 whose lateral surfaces match the diameter of the holding disks 15 and having upper edges 28 which overlap the substrates 2.

The device described above can be loaded in the horizontal position, and the substrates 2 can be coated or surface-treated in the vertical position.

Before the processing begins, the substrates 2 are drawn by vacuum against gaskets 19 on the upper surfaces of the holding members 15, the gaskets 19 preferably being a viscous sealing gel which is compressed by the atmospheric pressure. After the compression of the gaskets 19 the frame member 4 is placed on the substrate bed 3 and fastened to the latter by means of the clamps 7. At the processing pressure in the vacuum chamber, the gaskets 19 press the substrates 2 from the bottom against the flanges 28, forming a thin space 25. This space 25 can be flooded with gas for the cooling of the substrates 2 by passing a gas such as helium through the passages 14 and 22. As FIG. 4a clearly shows, there is also a gap 26 between the bottom of the limb 18 and the upper surface 5 of the substrate bed 3, the sealing ring 20 and the cylindrical edge surface of the holding disks 15. The gap 26 can also be flooded with the cooling gas.

I claim:

1. Apparatus for holding disk-shaped substrates in a vacuum chamber, said apparatus comprising
    a substrate bed having an upper surface with a periphery,
    a plurality of disk-shaped holding members on said upper surface of said substrate bed, each said holding member having an upper surface with a periphery,
    gasket means on the upper surface of each substrate bed about the periphery of each substrate bed,
    a frame member fitted over said upper surface of said substrate bed, said frame member having a plurality of apertures dimensioned to closely accommodate said disk-shaped holding members,
    means for fixing said frame member to said substrate bed, and
    bore means communicating between said upper surface of each disk-shaped holding member and a vacuum source, whereby,
    substrates of like diameter as said holding members may be positively positioned on said holding members by said frame member, thereby defining a space between each said substrate and a respective said holding member, and said substrates may be drawn toward said holding members by applying a vacuum in each said space.

2. Apparatus as in claim 1 wherein said substrate bed and said frame member each have a pair of opposed ends, said means for fixing said frame member to said substrate bed comprising a pair of clamps, each clamp being fitted against one of said ends of said substrate bed and one of said ends of said frame member, said means for fixing further comprising bore and pin means cooperating between each said clamp and each said end of said substrate bed and said frame member.

3. Apparatus as in claim 2 wherein said bore and pin means comprises
   bore means in each said end of said substrate bed and each said end of said frame member, and
   pin means on each said clamping member, said pin means being received in respective bore means to positively position said frame member relative to said substrate bed.

4. Apparatus as in claim 1 wherein each said frame member further comprises an annular flange about each said aperture at said top surface of said frame member, said flanges being dimensioned to extend over respective said holding members.

5. Apparatus as in claim 1 wherein said bore means communicates between said upper surface of each disk-shaped holding member and a gas source.

6. Apparatus as in claim 1 further comprising
   gasket means on the upper surface of said substrate bed about the periphery of said substrate bed, and
   bore means communicating between the upper surface of the substrate bed and at least one of a vacuum source and a gas source, said bore means communicating with said upper surface of said substrate bed between said disk-shaped holding members and said gasket means on said substrate bed.

* * * * *